(12) United States Patent
Lamanna et al.

(10) Patent No.: US 8,274,325 B2
(45) Date of Patent: Sep. 25, 2012

(54) PHASE-LOCKED LOOP

(75) Inventors: Pasquale Lamanna, Villeneuve-Loubet (FR); Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 77 days.

(21) Appl. No.: 12/921,198

(22) PCT Filed: Mar. 5, 2009

(86) PCT No.: PCT/EP2009/052631
§ 371 (c)(1), (2), (4) Date: Sep. 23, 2010

(87) PCT Pub. No.: WO2009/109637
PCT Pub. Date: Sep. 11, 2009

(65) Prior Publication Data
US 2011/0012652 A1  Jan. 20, 2011

(30) Foreign Application Priority Data
Mar. 7, 2008  (GB) .................................. 0804339.0

(51) Int. Cl.
*H03B 1/00* (2006.01)
(52) U.S. Cl. ........................................ 327/553; 327/156
(58) Field of Classification Search .................. 327/147, 327/148, 156, 157, 551, 552, 553, 554, 558
See application file for complete search history.

(56) References Cited

U.S. PATENT DOCUMENTS

| 4,942,370 A | 7/1990 | Shigemori |
| 5,521,948 A | 5/1996 | Takeuchi |

(Continued)

FOREIGN PATENT DOCUMENTS

EP  1 858 164 A1  11/2007

(Continued)

OTHER PUBLICATIONS

Meninger et al., "A 1-MHz Bandwidth 3.6-GHz 0.18-um CMOS Fractional-N Synthesizer Utilizing a Hybrid PFD/DAC Structure for Reduced Broadband Phase Noise," IEEE Journal of Solid-State Circuits, Apr. 2006, pp. 966-980, vol. 41, No. 4, IEEE.

(Continued)

*Primary Examiner* — Jeffrey Zweizig
(74) *Attorney, Agent, or Firm* — Novak Druce DeLuca + Quigg LLP

(57) ABSTRACT

A loop filter for receiving an input signal indicative of a phase-difference between a reference signal and a signal output by a signal generator and forming a control signal for controlling the signal generator in dependence thereon, the loop filter comprising a plurality of filter components that determine the frequency response of the filter, said filter components being arranged so that a first set of said components determines one or more zeros of the filter's frequency response and a second set of said components determines one or more poles of the filter's frequency response, each of said first and second sets of filter components being independent of the other such that the zero(s) and pole(s) of the filter's frequency response may be selected independently.

25 Claims, 8 Drawing Sheets

U.S. PATENT DOCUMENTS

| | | | |
|---|---|---|---|
| 6,806,742 B1 | 10/2004 | Briones et al. | |
| 7,091,759 B2 * | 8/2006 | Sowlati et al. | 327/157 |
| 7,277,518 B2 * | 10/2007 | Loke et al. | 375/373 |
| 7,330,058 B2 * | 2/2008 | Lin | 327/157 |
| 7,332,972 B2 * | 2/2008 | Vandel | 331/17 |
| 7,995,698 B2 * | 8/2011 | Liu et al. | 375/376 |
| 2002/0075091 A1 | 6/2002 | Lo et al. | |
| 2004/0232960 A1 | 11/2004 | Albasini et al. | |
| 2005/0094757 A1 | 5/2005 | Meninger et al. | |
| 2005/0248413 A1 | 11/2005 | Zhu et al. | |
| 2007/0126512 A1 | 6/2007 | Bellaouar et al. | |

FOREIGN PATENT DOCUMENTS

| | | |
|---|---|---|
| WO | 02/076009 A1 | 9/2002 |

OTHER PUBLICATIONS

Koo et al., "A Fully Integrated CMOS Frequency Synthesizer With Charge-Averaging Charge Pump and Dual-Path Loop Filter for PCS- and Cellular-CDMA Wireless Systems," IEEE Journal of Solid-State Circuits, May 2002, pp. 536-542, vol. 37, No. 5, IEEE.

Cassia et al, "Analytical Model and Behavioral Simulation Approach for a Pi Delta Fractional-N Synthesizer Employing a Sample-Hold Element," IEEE Transactions on Circuits and Systems—II: Analog and Digital Signal Processing, Nov. 2003, pp. 850-859, vol. 50, No. 11, IEEE.

* cited by examiner

PHASE-LOCKED LOOP

The invention relates to a loop filter for a phase-locked loop. The loop filter is arranged to receive a signal indicative of a phase-difference between a reference signal and a signal output by a signal generator of the phase-locked loop and to generate a control signal for controlling the signal generator in dependence on that signal.

A phase-locked loop is a circuit that generates an output signal having a predetermined frequency and/or phase relationship with a reference signal. A typical phase-locked loop is shown in FIG. 1. The phase-locked loop comprises an oscillator 101 for generating a signal of fixed frequency and a phase/frequency detector (PFD) for comparing the fixed frequency signal (the reference signal) with a feedback signal generated by a feedback loop 106. The PFD is connected to a charge pump 103. The PFD outputs a signal to the charge pump that is representative of the phase and/or frequency difference between the feedback signal and the reference signal. The charge pump injects a current into a loop filter 104 in dependence on the signal it receives from the PFD. Typically, this current injection will take the form of either an 'up' or 'down' current generated by current sources 108 and 109 respectively, so that current flows either into or out of the loop filter. In other words, the PFD and charge pump act together to output either positive or negative charge "pulses" in dependence on whether the reference signal phase leads or lags the feedback signal. The loop filter filters these charge pulses to generate a control signal for a signal generator 105.

The signal generator is typically a voltage-controlled oscillator (VCO) controlled by a tuning voltage at its control inputs. The loop filter is typically arranged to integrate the current pulses it receives from the charge pump to generate the tuning voltage necessary for controlling the VCO. If the feedback signal lags the reference signal, it is necessary to speed up the VCO. Conversely, if the feedback signal leads the reference signal, it is necessary to slow down the VCO.

The frequency of the signal output by the phase-locked loop can be changed by varying the frequency of the reference signal. Often, the reference signal is generated by a very stable oscillator whose frequency cannot be varied. Therefore, it can be beneficial to include a divider in the feedback loop so that the output frequency of the phase-locked loop can be varied without having to change the frequency of the reference signal. In FIG. 1, this divider is shown at 107. If the divide ratio is a constant N, then the loop forces the output signal to be exactly N times the reference signal frequency. The divide ratio N can be changed in integer steps to change the frequency of the signal generator.

One limitation with this type of phase-locked loop is that the output frequency cannot be varied in steps any smaller than the reference frequency. This is because N can only have integer values, so that the smallest change in the output frequency that can be made is $1 \times F_{REF}$. Therefore, for fine frequency resolution, it is preferred to have a small reference frequency. However, due to mismatches in the phase-locked loop's charge pump and other factors such as the non-ideal behaviour of the PFDs, the charge pump tends to output small charge pulses that cause sidebands to appear in the output signal of the VCO, even when the phase-locked loop is locked. These sidebands appear at offsets equal to the reference frequency. Therefore, if the reference frequency is small, a narrower loop filter bandwidth is required to remove the sidebands. Phase-locked loops with narrower loop filter bandwidths take longer to transition from one frequency to another and may not operate at the required speed. Also, the narrower the loop filter's bandwidth, the less the VCO's phase noise is suppressed.

One way of achieving a lower reference frequency for an integer PLL is to put a 1/M divider between the reference signal and the PFD. Another solution is to use a fractional-N divider. Fractional-N synthesis involves varying the division ratio periodically between two integer values, as shown in FIG. 2. The overall division ratio is then determined by N plus a fractional value determined by the time for which a division ratio of N+1 is used relative to a whole time period (i.e. the time for which a division ratio of N is used plus the time for which a division ratio of N+1 is used).

A problem with a fractional-N division architecture is that the modulation of the division ratio causes a huge transient voltage at the input to the VCO. To partially compensate for this effect, DAC compensation can be performed in parallel with the charge pump output. An example of a circuit using DAC compensation is shown in FIG. 3. FIG. 3 illustrates the PFD charge pump 301, the DAC compensation unit 302 (which is also a charge pump), the loop filter 303 and the VCO 304. The deterministic jitter caused by the modulation of the division ratio is known in advance. The DAC compensation unit works by generating a current that is the inverse of the error current caused by the modulation of the division ratio. This is then summed by the loop filter with the current output by the charge pump.

The PFD charge pump outputs a constant current for a length of time that is dependent on the phase difference between the feedback signal and the reference signal, while the DAC compensation unit outputs a current for a constant time but with a magnitude that is dependent on the deterministic jitter resulting from the modulation of the division ratio. Therefore, although by summing these two currents together in the loop filter the amount of charge introduced into the system on average by deterministic jitter is compensated for, it does not suppress the transients that are an inherent part of the structure.

A typical loop filter for a phase-locked loop is shown at 303 in FIG. 3 and comprises a resistor 305 and a capacitor 306 that are both arranged to receive currents input by a charge pump 301 and a DAC compensation unit. The filter also comprises a further capacitor 307 connected in parallel with the components that receive the current initially for smoothing the output of the filter and thereby removing any high frequency transients. Of the resistor and capacitor that initially receive the input currents, the resistor provides a proportional component of the signal output by the filter whereas the capacitor provides an integral component of the signal output by the filter. Capacitor 306 therefore performs the phase acquisition of the filter while resistor 305 contributes to loop filter stability by introducing a zero.

One problem with the loop filter as shown in FIG. 3 is that it is impossible to produce a truly optimal filter because all of the components are interrelated. For example, it is preferable to minimise the size of the resistor 305 for noise reasons. However, the size of the resistor can only be reduced by increasing in the same ration the values of capacitors 306 and 307 and by increasing the current generated by the charge pump. This leads to a noise/silicon surface trade-off as the values of the two capacitors cannot be increased without a corresponding increase in the surface area of silicon required for the circuit.

Therefore, there is a need for a more flexible loop filter.

According to a first embodiment of the invention, there is provided a loop filter for receiving an input signal indicative of a phase-difference between a reference signal and a signal output by a signal generator and forming a control signal for controlling the signal generator in dependence thereon, the loop filter comprising a plurality of filter components that determine the frequency response of the filter, said filter components being arranged so that a first set of said components determines one or more zeros of the filter's frequency response and a second set of said components determines one or more poles of the filter's frequency response, each of said first and second sets of filter components being independent of the other such that the zero(s) and pole(s) of the filter's frequency response may be selected independently.

The loop filter may be arranged such that the gain of the filter's frequency response may be selected independently of the pole(s) and zero(s).

One or more of the filter components may have a resistance and/or reactance that is adjustable by means of which each of the gain, pole(s) and zero(s) of the filter's frequency response may be adjusted independently.

The loop filter may be arranged to form a control signal for controlling the signal generator, the control signal comprising a proportional component and an integral component, wherein the loop filter comprises a proportional path arranged to generate the proportional component of the control signal and an integral path arranged to generate the integral component of the control signal.

The first set of components may form the forms the proportional path. The second set of components may form the integral path.

The loop filter may comprise an input node arranged to receive a signal indicative of the instantaneous phase difference between the output signal and the reference signal, the proportional path being connected to that input node.

An output of the proportional path may be connected to an input of the integral path, such that the signal representative of the instantaneous magnitude of the phase difference received by the integral path is the proportional component of the control signal output by the proportional path.

The loop filter may comprise an output node connected to a control input of the signal generator, the integral path being connected to that output node.

The integral path may be arranged to integrate the proportional component and to sum this integral with the proportional component such that the signal output to the signal generator represents the integral component and the proportional component.

The proportional path may comprise a resistive element and/or a low pass filter. The resistive element may be connected between the input node and the low pass filter.

The resistive element may be a switched capacitor comprising a capacitive element, a first switch connected to the input node and a second switch connected to the low-pass filter, the capacitive element being coupled between the first and second switches such that, when the first switch is closed, a current flows from the input node to the capacitive element, and when the second switch is closed, a current flows from the capacitive element to the low pass filter.

One end of the capacitive element may be connected to the first and second switches and the other end of the capacitive element may be connected to a further switch, said further switch being capable of connecting the other end of the capacitive element to either a reference voltage or to circuit ground.

The reference voltage may be non-zero.

The loop filter may be arranged to perform a two-stage filtering process such that, during a first time period, the first switch connects said one end of the capacitive element to the input node, the second switch being open, and the further switch connects the other end of the capacitive element to the reference voltage, whereby current flows from the input node to the capacitive element, and during a second time period, the second switch connects said one end of the capacitive element to the low pass filter, the first switch being open, and the further switch connects the other end of the capacitive element to circuit ground, whereby current flows from the capacitive element to the low pass filter.

The integral path may be connected to the output of the low-pass filter of the proportional path.

The integral path may comprise a differential amplifier comprising a first input arranged to receive the output of the low-pass filter of the proportional path. The differential amplifier may comprise an output connected to the control input of the signal generator. The differential amplifier may comprise a second input connected to a resistive element. The resistive element connected to the second input of the differential amplifier is a switched capacitor.

The switched capacitor may comprise a capacitive element and first and second switches, the capacitive element having one end connected to the first and second switches and the other end connected to the first switch and a reference voltage, the second switch being connected to the second input of the differential amplifier, the integral path being arranged such that when the first switch is closed and the second switch is open, both ends of the capacitive element are connected to the reference voltage and when the first switch is closed and the second switch is open, said one end of the capacitive element is connected to the second input of the differential amplifier and said other end is connected to the reference voltage.

The differential amplifier may be arranged such that a gain of the differential amplifier is dependent on a switching frequency of the first and second switches. The differential amplifier may be arranged such that a gain of the differential amplifier is dependent on a capacitor ratio.

According to a second embodiment of the invention, there is provided a phase-locked loop comprising a loop filter as claimed in any of claims 1 to 25.

The phase-locked loop may comprise a control unit arranged to control the operation of the switches.

For a better understanding of the present invention, reference is made by way of example to the following drawings, in which.

A loop filter may be arranged to receive an input signal indicative of a phase-difference between a reference signal and a signal output by a signal generator. The loop filter may be arranged to form a control signal for controlling the signal generator in dependence on the received signal. The loop filter may comprise a plurality of filter components that determine the frequency response of the filter. The filter may be arranged so that the plurality of components form two separate sets of filter components so that each component is part of either the first set or the second set, but not both. The first set of said components may determine one or more zeros of the filter's frequency response and a second set of said components may determine one or more poles of the filter's frequency response. The zeros, poles and gain of the filter's frequency response may therefore be selected independently.

Figure 1:
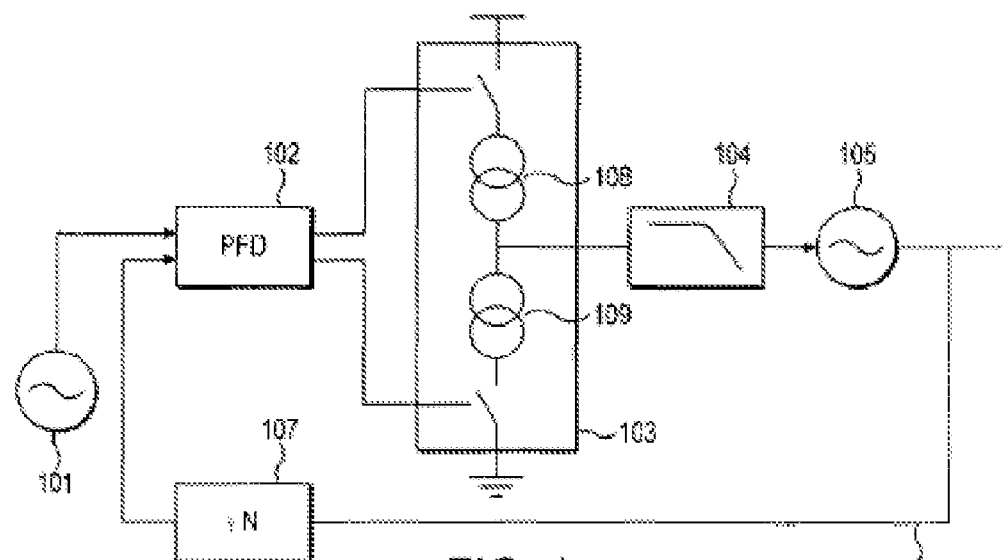
FIG. 1 shows a typical phase-locked loop.
Figure 2:
FIG. 2 shows how fractional-N division may be achieved.
Figure 3:
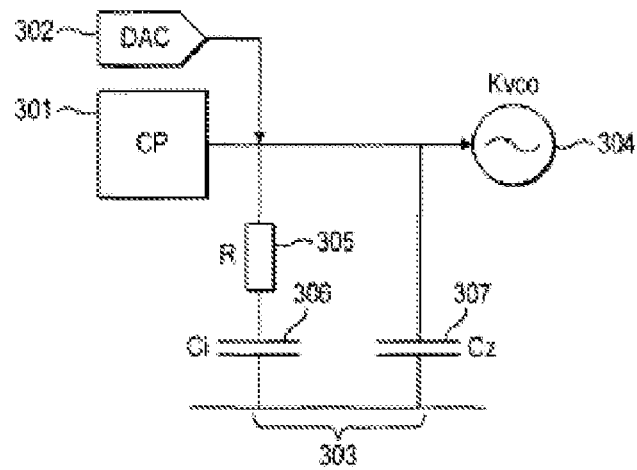
FIG. 3 shows a circuit incorporating DAC compensation.
Figure 4:
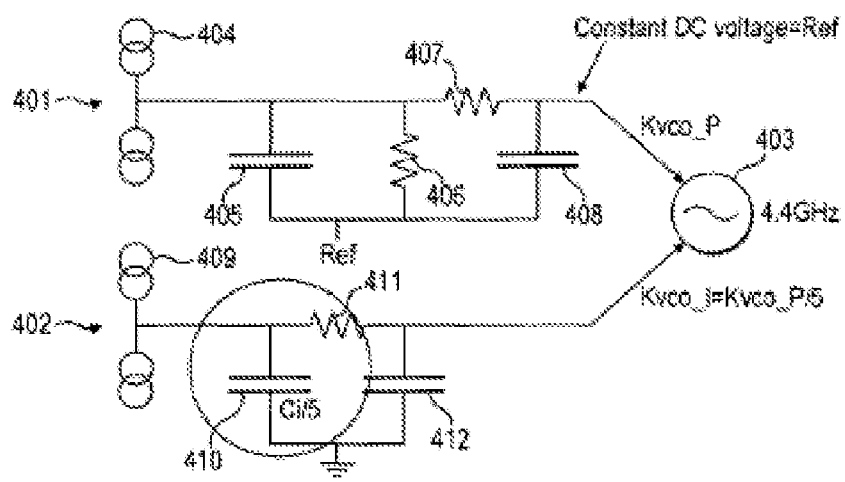
FIG. 4 shows a loop filter having decoupled proportional and integral paths.

FIG. 4 shows a loop filter for a phase-locked loop that comprises decoupled integral and proportional paths. The proportional path is shown at 401 and the integral path is shown at 402. Each of the paths is arranged to generate a respective component of the control signal for the VCO 403 in dependence on an input signal that is indicative of a phase-difference between the reference signal and the signal output by the VCO.

The proportional path is arranged to receive an input current from a charge pump 404 (which may be a combination of a PFD charge pump and a DAC compensation unit, as discussed above). The proportional path comprises a resistor 406 and a low-pass filter formed by a combination of resistor 407 and capacitor 408. The proportional path also includes a capacitor 405 for summing the currents received by the charge pump (e.g. the separate currents received for PFD and DAC compensation). This helps to reduce transients caused by the mismatch between the charge pulses produced by the PFD and DAC compensation units. Because the proportional path would have an output voltage of zero volts if it were referenced to ground, the proportional path is referenced to a non-zero reference voltage to correctly set the midpoint of the charge pump.

The integral path comprises a charge pump 409, which is suitably identical to the charge pump 404 of the proportional path, so that both paths receive the same charge pulses from their respective charge pumps. The integral path also comprises a capacitor 410 for integrating the input currents and a low-pass filter formed by resistor 411 and capacitor 412 to remove any high-frequency noise.

The circuit shown in FIG. 4 may be advantageous because the proportional and integral paths have been decoupled, so that both have a transfer function linking the input current they receive to the respective component of the VCO control signal they are arranged to form that is independent of the other path. This decoupling of the integral and proportional paths means that the loop filter is more flexible than pre-existing circuits because both paths can be optimised to perform its respective function without affecting the other path. Therefore, fewer compromises are required when choosing component values.

The circuit shown in FIG. 4 is also advantageous because the poles, zeros and gain can be set independently. This gives the circuit flexibility and also means that the poles, zeros and gain of the circuit can be dynamically adjusted during operation (e.g. by using digitally adjustable capacitors). Thus, the circuit can be optimised for fast locking, when the loop has not stabilised at the reference frequency, and for normal operation, when the loop has stabilised. The loop may also be optimised for the different requirements of transmit and receive operations.

Figure 5:
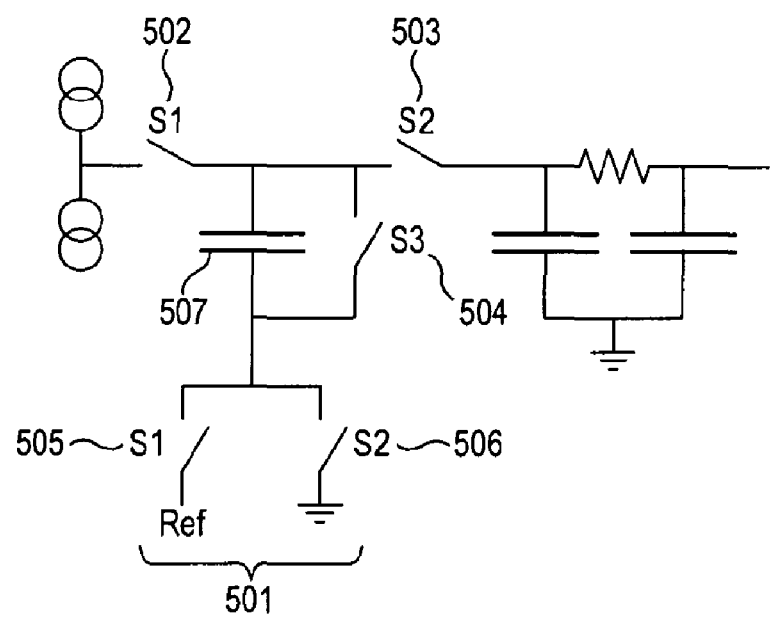
FIG. 5 shows a proportional path having a switched capacitor.

The proportional path shown in FIG. 4 still includes resistor 404 that introduces noise. FIG. 5 shows an improved version of the proportional path in which this resistor has been replaced by a switched capacitor arrangement 501, which is less noisy. The switched capacitor 507 is connected via a first switch 502 to the charge pump and via a second switch 503 to the low-pass filter. The loop filter is thus arranged to operate over two time periods. During the first time period, the first switch is closed and the second switch is open such that the capacitor receives a current flow from the charge pump. During the second time period, the first switch is open and the second switch is closed such that the capacitor discharges into the low pass filter. A third switch 504 may also be provided for ensuring that the capacitor is completely discharged before a current is once again received from the charge pump. The "resistance" of the switched capacitor is determined by the value of the capacitor and the switching frequency of switches 502 and 503.

In a further improvement, another switching arrangement may be provided to switch the base plate of capacitor 507 between the non-zero reference voltage and ground. In FIG. 5 this switching arrangement is provided by switches 505 and 506, which are arranged to connect the base plate of the capacitor to the non-zero reference voltage during the first time period and to ground during the second time period. Therefore, the bias point of the charge pump is still correctly set during the first time period, but this noisy reference voltage is no longer used for the second time period, which is instead referenced to ground.

Figure 6:
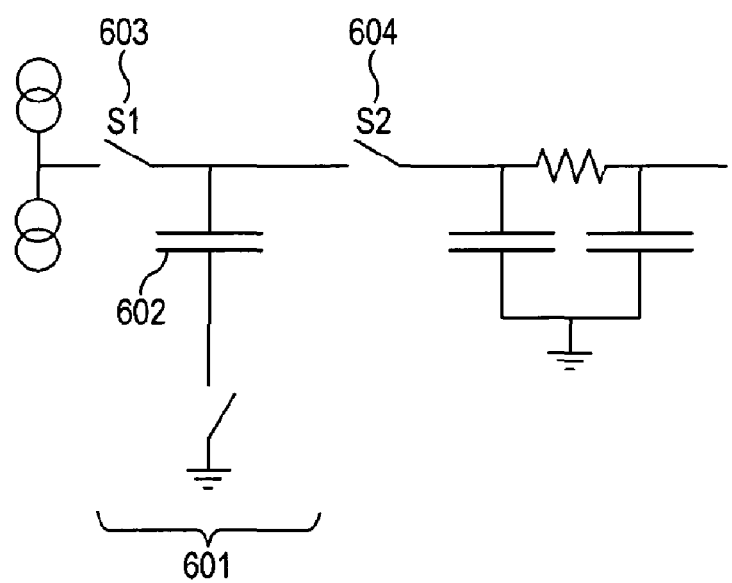
FIG. 6 shows an integral path having a switched capacitor.

A similar switched capacitor arrangement can be used in the integral path, as shown in FIG. 6. As before, switched capacitor arrangement 601 comprises a capacitor 602 connected via a first switch 603 to the charge pump and via a second switch 604 to the low-pass filter. The first and second switches thus enable a proportion of the charge output by the charge pump to be transferred to the remainder of the loop filter. The integral path thus performs a similar two-stage acquisition and hold process to the proportional path shown in FIG. 5.

Figure 7:
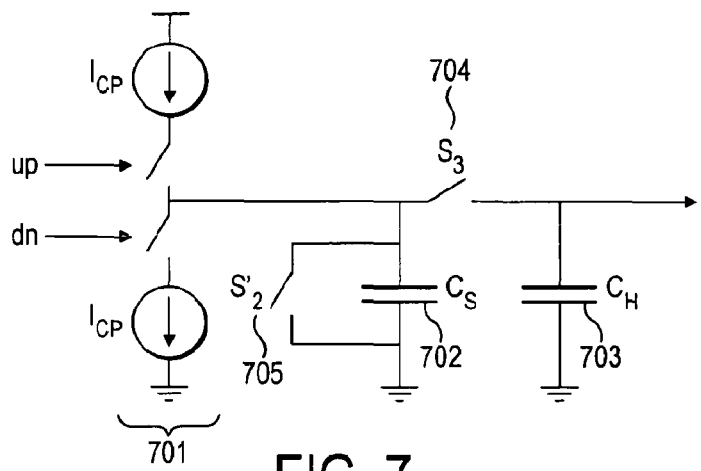
FIG. 7 shows a core circuit of the loop filter.

One of the factors that has an effect on the noise of the filter is the charge pump current. Typically the higher the charge pump current the lower the noise. However, the charge pump current also has an effect on the capacitor values required in the rest of the circuit. Therefore, it would be advantageous to decouple the charge pump current from the remainder of the circuit. An example of a proportional path that achieves this decoupling is shown in FIG. 7. In FIG. 7 the switched capacitor has been separated into two parallel capacitors 701 and 702. Both capacitors are connected to the charge pump during the first time period but only the second capacitor is connected to the low-pass filter during the second time period. Thus, the value of capacitor 701 can be set to optimise the charge pump current while the value of capacitor 702 can be set to optimise the remainder of the circuit. A similar modification can be made to the integral path.

The phase-locked loop may comprise suitable control means for opening and closing the switches. For example, the control means may be implemented purely in hardware or may be a processor operating under software control.

The loop filter will now be described in more detail with reference to the appropriate design equations. The design equations will first be given for only the core of the loop filter circuit and will then be extended to the complete circuit. Timing references for the switches are synchronized on $T_{REF}$.

The core of the loop filter circuit is shown in FIG. 7. The circuit comprises a charge pump 701, an acquisition capacitor 702, a hold capacitor 703 and a switching arrangement provided by switches 704 and 705. During one half of the reference period, the circuit is in acquisition mode, i.e. switch $S_3$ is OFF and the error charge generated by the charge pump $Q_E(t)$ is stored into $C_S$. In the second half of Reference period, the charge pump is inactive and switch $S_3$ is ON. A charge is therefore transferred between $C_S$ and $C_H$.

The transfer function of the filter is:

$$H(z) = \frac{I_{CP}}{2\pi T_{REF}(C_S + C_H)} \cdot \frac{1}{1 - \frac{C_H}{C_H + C_S} \cdot z^{-1}} \quad 1.1a$$

$$H(e^{sT_{REF}}) = \frac{I_{CP}}{2\pi T_{REF} C_S} \cdot \frac{1}{1 + \frac{C_H}{C_S} \cdot sT_{REF}} \quad 1.1b$$

As equation 1.1b shows, the discrete time loop filter introduces a pole that can be accurately chosen by a specified capacitance ratio and which depends from $T_{REF}$.

Before starting a new acquisition process in the (n+1) $T_{REF}$ time period, switch $S'_2$ is closed for a short period $\Delta t$ to eliminate any residual charges on $C_S$ due to the fact that no active components are used to ensure a complete transfer of charge from $C_S$ to $C_H$.

Figure 8A:
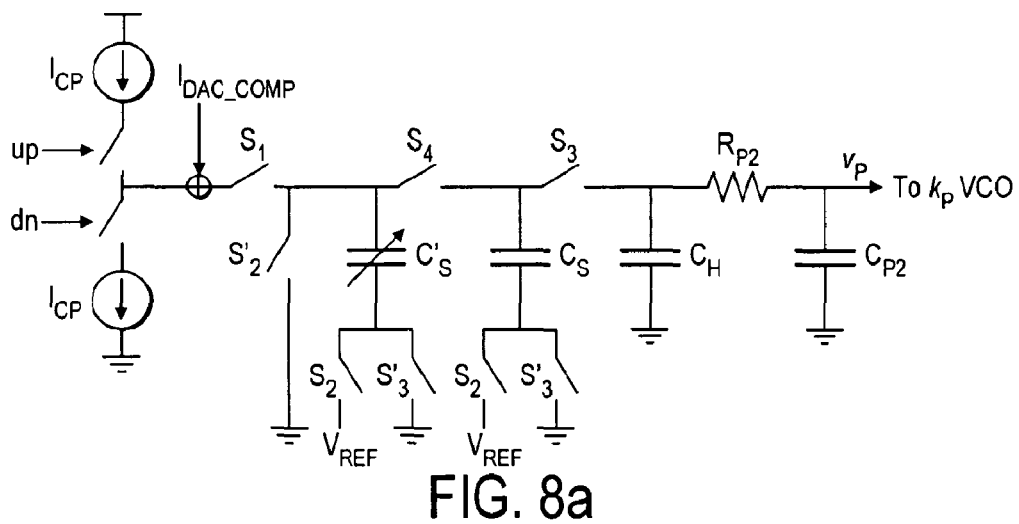
FIGS. 8a and 8b show a proportional path and an integral path for a dual-loop filter.
Figure 8B:
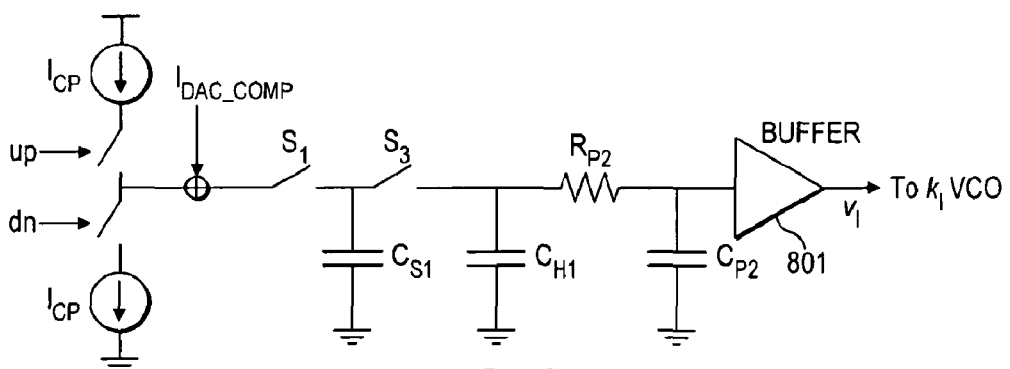

This analysis will now be extended to the dual loop filter shown in FIGS. 8a and 8b. FIG. 8a shows the proportional path of the loop filter and FIG. 8b shows the integral path.

The proportional path contributes to loop stability by introducing a second pole (it is the counterpart of zero stabilization of continuous time filter). The integral path gives the phase acquisition of the phase-locked loop. For this reason the integral path requires a buffer 801 for reducing leakage, whereas in the pole path a buffer is dispensable because the output voltage will be 0V. Noise in $V_{REF}$ is not necessarily problematic because $C'_S$ carries input information in current mode. Therefore, a very clean reference voltage is not required.

Figure 9:
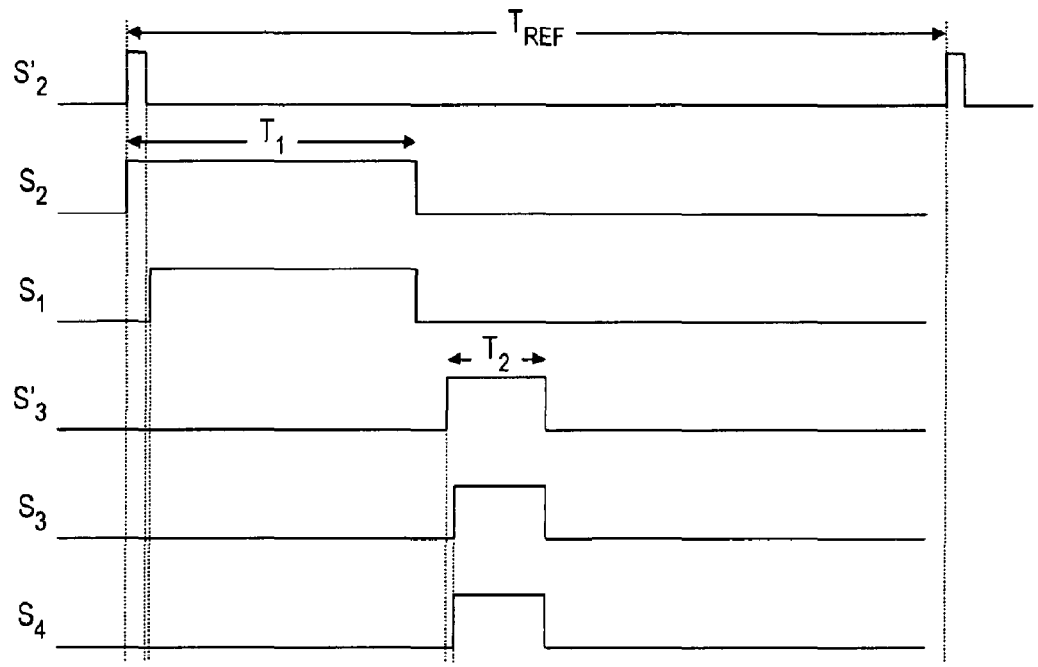
FIG. 9 shows a timing diagram for a dual loop filter.

A timing diagram for the dual loop filter shown in FIGS. 8a and 8b is given in FIG. 9. Note that all switches are active HIGH. In the figure, $$T_1 + T_2 \leq \frac{T_{REF}}{2} \text{ and } T_{settling} < T_1.$$

First, switch $S'_2$ is switched ON to discharge the sampling capacitor. Any residual charges in the sampling capacitor would cause an error offset in the output voltage. Switch $S2$ connects capacitors $C'_S$ and $C_S$ to $V_{REF}$ for the ACQUISITION period due to limits on the output dynamic range for the charge pump. Switch $S_1$ is switched ON during the ACQUISITION period so that current can flow between the charge pumps and capacitors $C'_S$ and $C_S$. All other switches are OFF during the ACQUISITION period.

Switch $S'_3$ is switched ON at the start of the HOLD period to connect the base plates of capacitors $C'_S$ and $C_S$ to ground. Switch $S_1$ is used for eliminating the effect of high non-linear capacitive effects caused by the charge pump during the HOLD period and so is switched OFF during the HOLD period. $S1$ switches OFF just before $S_3$ switches ON. Switch $S_3$ is switched ON for the settling time required to complete the charge redistribution between $C_S$ and $C_H$ during the HOLD period.

The sampling capacitor may be implemented as a parallel combination of four capacitive elements. These capacitive elements may, for example, each have a value of 1 pF. During the acquisition or sampling phase, all of these individual capacitive elements are connected to the charge pump, whereas during the hold phase a chosen number (which may be a function of $T_{REF}$ input frequency) are connected to the hold capacitor $C_H$ by means of switch $S4$. Switch $S_4$ therefore defines the number of charged capacitor ($C'_S + C_S$) that are connected to hold capacitor $C_H$ capacitor during the transfer of charge operation. One reason for this is that we want the proportional path to provide a "low pole" for stability, which would require a low value for $C_S$. However, using a low value for $C_S$ would cause a conflict with the requirement for the phase-locked loop to have a fast locking time. Having a $C'_S + C_S$ value of 4 pF is a good compromise. Capacitor $C_H$ may suitably be in the range 10 pF to 40 pF, as a function of input frequency for a given bandwidth.

Figure 10:
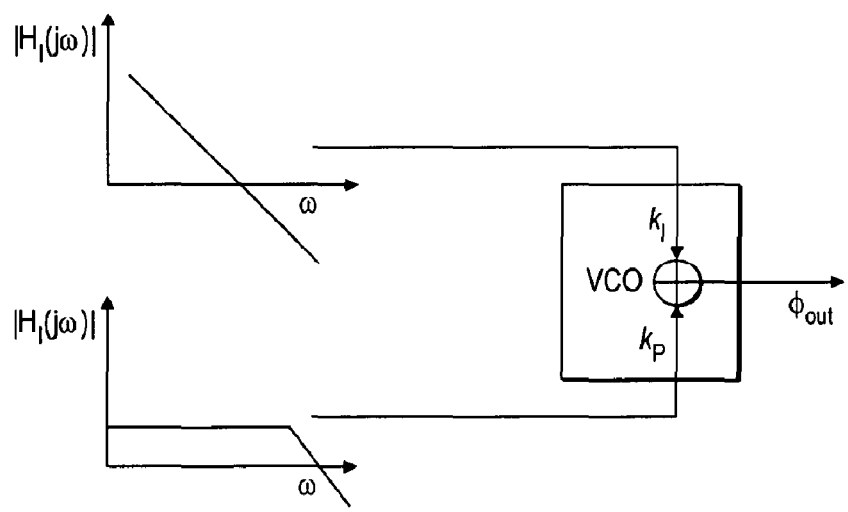
FIG. 10 shows frequency plots of transfer functions for the integral and proportional paths.

The transfer function for the circuit will now be given with reference to FIG. 10, which shows the frequency response of the system for a VCO having dual input voltage control.

$$\phi_{out}(s) = \frac{k_I}{s} \cdot v_I(s) + \frac{k_P}{s} \cdot v_P(s) = \frac{k_I}{s} \cdot \frac{\left[1 + s\left(\frac{C_H}{C_S} + \frac{C_I \cdot k_P}{C_S k_I}\right)T_{REF}\right]}{sC_I(1 + s\tau_1)(1 + s\tau_2)} \quad 1.2$$

$$\text{where } v_P(s) = \frac{T_{REF} \cdot I_{CP}}{C_S(1 + s\tau_1)(1 + s\tau_2)}, \quad v_I(s) = \frac{I_{CP}}{sC_I(1 + s\tau_2)}$$

$$\text{and } \tau_1 = \frac{C_H}{C_S} \cdot T_{REF}$$

$$\text{and } \tau_2 = C_2 \cdot R_2.$$

The open loop transfer function for the phase-locked loop is:

$$H_{open\_loopt}(s) = \frac{I_{CP}}{2\pi N_{nom}} \frac{k_I}{s} \cdot \frac{\left[1 + s\frac{T_{REF}}{C_S}\left(C_H + C_I \frac{k_P}{k_I}\right)\right]}{sC_I(1 + s\tau_1)(1 + s\tau_2)} \quad 1.3$$

The cross-over frequency is:

$$\omega_{cross\_over} \approx \frac{I_{CP} k_I}{2\pi N_{nom} C_I} \cdot \frac{T_{REF}}{C_S}\left(C_H + C_I \frac{k_P}{k_I}\right) \quad 1.4$$

And, with the assumption that the zero is a multiple of a times the cross-over frequency below that frequency and the pole is a multiple of $\beta$ times the cross-over frequency above that frequency, the following equations are obtained:

$$\left[\left(C_H + C_I \frac{k_P}{k_I}\right)\frac{T_{REF}}{C_S}\right]^2 \approx \frac{2\alpha\pi C_I N_{nom}}{I_{CP} k_I} \quad 1.5$$

$$\frac{C_H}{C_S} T_{REF}\left(C_H + C_I \frac{k_P}{k_I}\right)\frac{T_{REF}}{C_S} \approx \frac{2\pi C_I N_{nom}}{\beta I_{CP} k_I} \quad 1.6$$

In the above analysis contribution of second pole of filter has been assumed to be correctly placed and therefore have a negligible effect on system stability.

As equation 1.4 shows, the cross-over frequency is function of $T_{REF}$ and $N_{nom}$. These two parameters therefore have the potential to change the behaviour of the system. The capacitance values may be digitally controlled to help compensate for this effect.

Dividing equation 1.5 by equation 1.6 yields:

$$\left(1 + \frac{k_P}{k_I} \cdot \frac{C_I}{C_H}\right) = \alpha \cdot \beta \qquad 1.7$$

From equation 1.4 we can find $C_S$ as function of the loop parameters:

$$C_S \approx \frac{I_{CP} k_P}{(2\pi) N_{nom}} \cdot \frac{1}{f_{cross\_over}} \cdot \frac{1}{f_{ref}} \cdot \frac{1}{(\alpha \cdot \beta - 1)} \alpha \cdot \beta \qquad 1.8$$

The value for the hold capacitor $C_H$ can be calculated by inserting equations 1.7 and 1.4 in equation 1.5:

$$C_H \approx \frac{I_{CP} k_P}{(2\pi)^2 N_{nom}} \cdot \frac{\alpha}{(f_{cross\_over})^2} \cdot \frac{1}{(\alpha \cdot \beta - 1)} \qquad 1.9$$

The integrated capacitor value $C_I$ is obtained using equation 1.5 and equ. 1.7

$$C_I \approx \frac{I_{CP} k_I}{(2\pi)^2 N_{nom}} \cdot \frac{\alpha}{(f_{cross\_over})^2} \qquad 1.10$$

N.B. In the above equations the VCO gain is in rad/Vsec.

Using these techniques to design a loop filter for a phase-locked loop, a number of advantages can be achieved. First, the signal generator is no longer subjected to the transient effects of phase noise charge injection and charge compensation transient on its $V_{CTRL}$ node. Also, it is possible to achieve a reduction of loop filter capacitance, which reduces the silicon area required on a chip to implement the loop filter.

With following loop parameter components:

TABLE 2.1

| | |
|---|---|
| Icharge_pump | 200 uA |
| Ref Clock ($T_{REF}$) | 10 MHz |
| BW | 100 kHz |
| Phase margin 60° | $\alpha = \beta = 4$ |
| $K_I$ | 20 MHz/V |
| $K_P$ | 200 MHz/V |
| $F_{out}$ | 4488 MHz |
| $N_{nom}$ | 448.8 | required values for the loop components are:

TABLE 2.2

| Component | value | unit |
|---|---|---|
| $C_S$ | 14 | pF |
| $C_H$ | 66 | pF |
| $C_I$ | 89 | pF |

Some advantages of using a dual loop filter such as that shown in FIGS. 8a and 8b (in addition to the flexibility offered by the decoupled paths) are as follows.

First, there is no transient voltage error due to the temporal shape mismatch in the currents output by the PFD compensation charge pump and the DAC compensation charge pump. Only the difference between the two integrated currents is transferred to the main body of the loop filter during the HOLD period. This difference can be made arbitrarily small by increasing the precision of the DAC.

Second, the noise contribution of the $R_z$ resistor has been removed and replaced by the noise contribution of the sampling capacitor, which is given by kT/C and it typically at least 60 dB below the noise contribution of the $R_z$ resistor.

Third, the pole frequency and zero frequency are set only by a ratio of capacitors and are therefore not process or temperature dependent. The PLL loop bandwidth can be tuned dynamically by switching the amount of capacitor and the charge pump current (to provide fast lock or a phase-locked loop having a digitally programmable bandwidth).

Fourth, the charge pump current can be decoupled from the capacitance of the loop filters by not transferring all the charge stored in the sampling capacitors during the ACQUISITION phase to the low-pass filter during the HOLD phase. This effectively results in a noise-less capacitive division of the charge pump current. Therefore, the charge pump current can be set according to noise considerations and the low-pass filter can be independently optimized for on-chip area.

Fifth, the transfer phase (corresponding to switch S3) can be made very short (e.g. a few nS) and therefore any glitch created by charge injection, gate capacitance etc can be efficiently filtered out by the following low-pass filter.

Finally, this architecture does not require a operational amplifier to perform charge transfer or to generate a reference voltage (since every capacitor is referenced to ground during the HOLD phase) and therefore offers superior noise immunity.

Although the dual loop filter shown in FIGS. 8a and 8b is very attractive, it does have some disadvantages. Notably, it requires two PFD charge pumps and two DAC charge pumps: one of each for the integration path and another one of each for the pole path. If the signal received and processed by the integration path could be extracted from the pole path rather than being generated by two charge pumps, analogue complexity could be reduced. An example of such a circuit is shown in FIG. 11.

Figure 11:
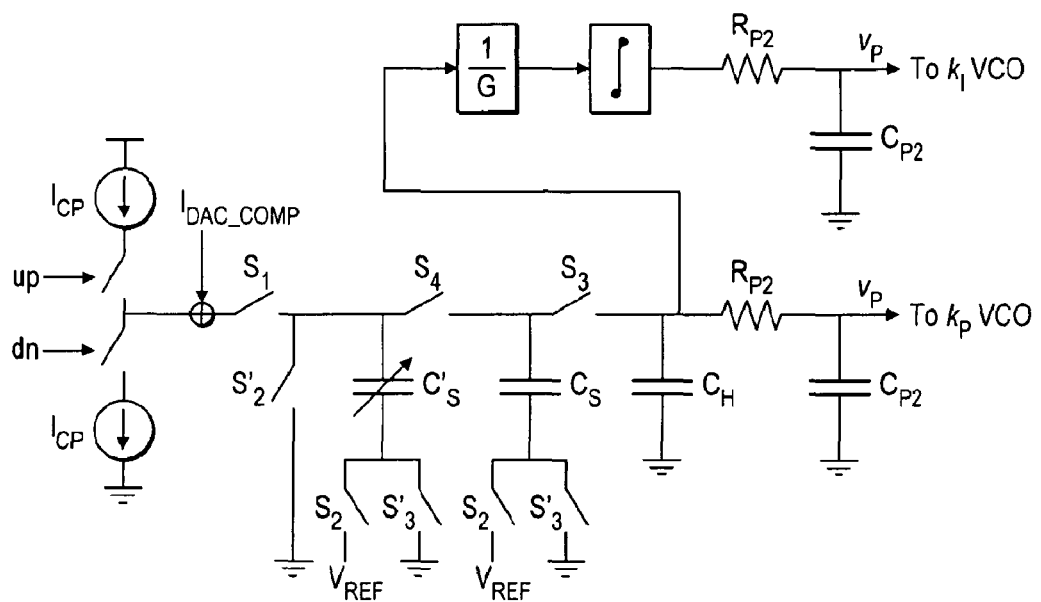
FIG. 11 shows an implementation in which the proportional path generates the input signal for the integral path.
Figure 12:
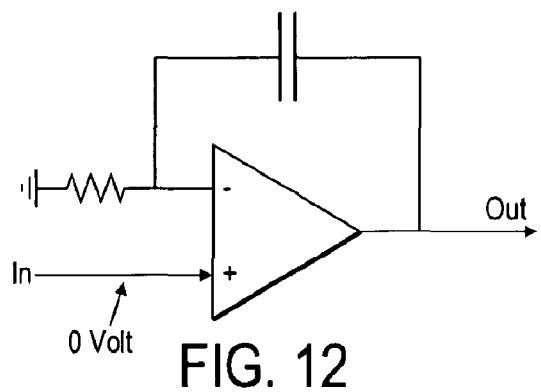
FIG. 12 shows a circuit for integrating the output of the proportional path.

One way of implementing the circuit shown in FIG. 11 is by using an low-noise operational amplifier arranged in a combination of a follower topology and an integrator topology, so that the operational amplifier effectively sums the output of the proportional path with an integrated version of that output. An example of such a circuit is shown in FIG. 12. The output of the circuit is given by:

$$\text{out} = \text{in} + \frac{1}{RC} \int \text{in} \cdot dt \qquad 2.1$$

Therefore, if the output of the low-pass filter of the proportional path is connected to the input of the circuit shown in FIG. 12, that signal will be both integrated and passed unchanged through the circuit of FIG. 12 such that the output of the operational amplifier comprises both the proportional and integral components of the control signal.

Figure 13:
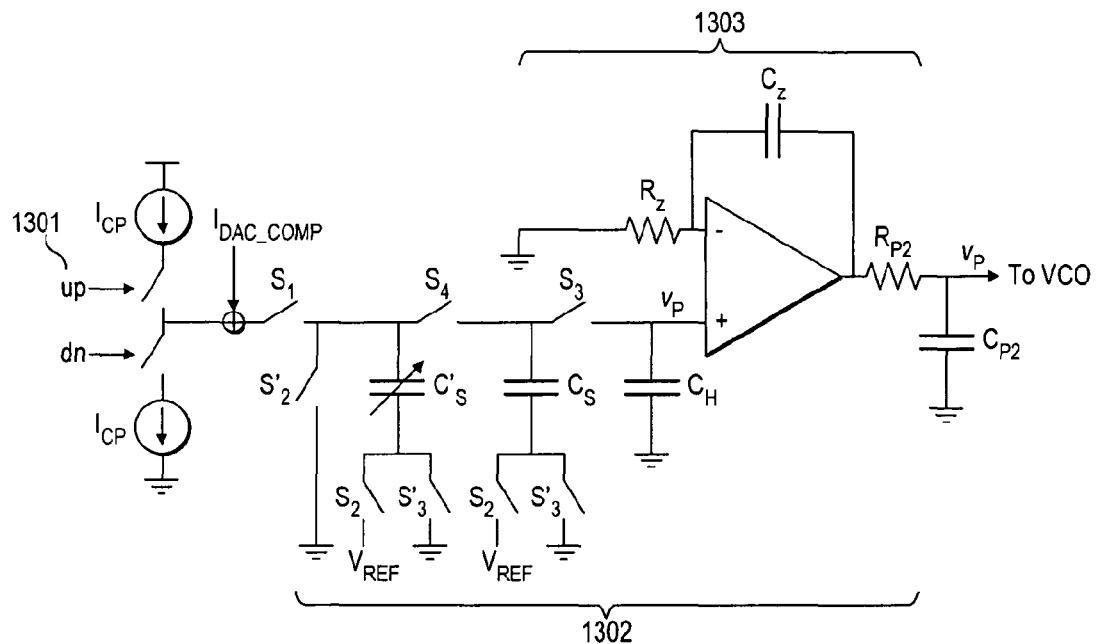
FIG. 13 shows a loop filter comprising the circuit of FIG. 12.

A version of the loop filter that combines the proportional path of previous versions with the circuit of FIG. 12 is shown in FIG. 13. This filter comprises just one PFD charge pump and one DAC compensation charge pump 1301, a proportional path 1302 and an integral path 1303. In this circuit, both the proportional path and the integral path receive an input signal indicative of the phase difference between the reference signal and the output of the signal generator. This is as before, except that in this version of the loop filter, the signal received by the integral path is output by the proportional path rather than a charge pump. Also, the proportional path has effectively been extended to incorporate the operational amplifier of the integral path, since the proportional component of the control signal is output from the operational amplifier. However, although the decoupling of the integral and proportional paths in the circuit of FIG. 13 may be less obvious than in other versions of the filter, the ability of the integral path to pass the output of the proportional path unchanged means that each path still has a transfer function linking its received signal to its respective component of the control signal that is independent of the other path. Thus, the filter is still fully tunable so that its poles, zeros and gains can be set independently.

The open-loop transfer function for the filter shown in FIG. 13 is:

$$H_{open\_loopt}(s) = \frac{I_{CP}}{2\pi N_{nom}} \frac{k_{VCO}}{s} \frac{T_{REF}[1 + sC_Z R_Z]}{sC_Z C_S R_Z (1 + s\tau_1)(1 + s\tau_2)} \quad 2.2$$

The cross-over frequency is:

$$\omega_{cross\_over} \approx \frac{I_{CP} k_{VCO}}{2\pi N_{nom}} \cdot \frac{T_{REF}}{C_S} \quad 2.3$$

And, assuming that the zero is a multiple of a times the cross-over frequency below that frequency:

$$R_Z C_Z \approx \frac{2a\pi C_S N_{nom}}{I_{CP} k_{VCO} T_{REF}} \quad 2.4$$

Figure 14:
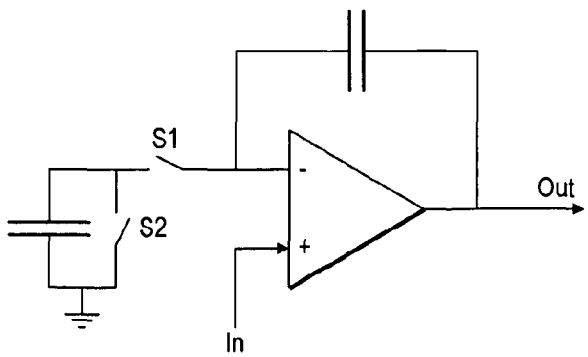
FIG. 14 shows a circuit for integrating the output of the proportional path that includes switched capacitors.

As resistors tend to be noisy, it may be advantageous to replace the resistor $R_Z$ with a switched capacitor, as shown in FIG. 14. The output signal is then given by:

$$out = in + \frac{C_S \cdot F_{REF}}{C} \int in \cdot dt \quad 2.5$$

where $F_{REF}$ is the switching frequency of the switched capacitor. Therefore, the integration path gain can be programmed by varying the switching frequency of the switched capacitor.

Figure 15:
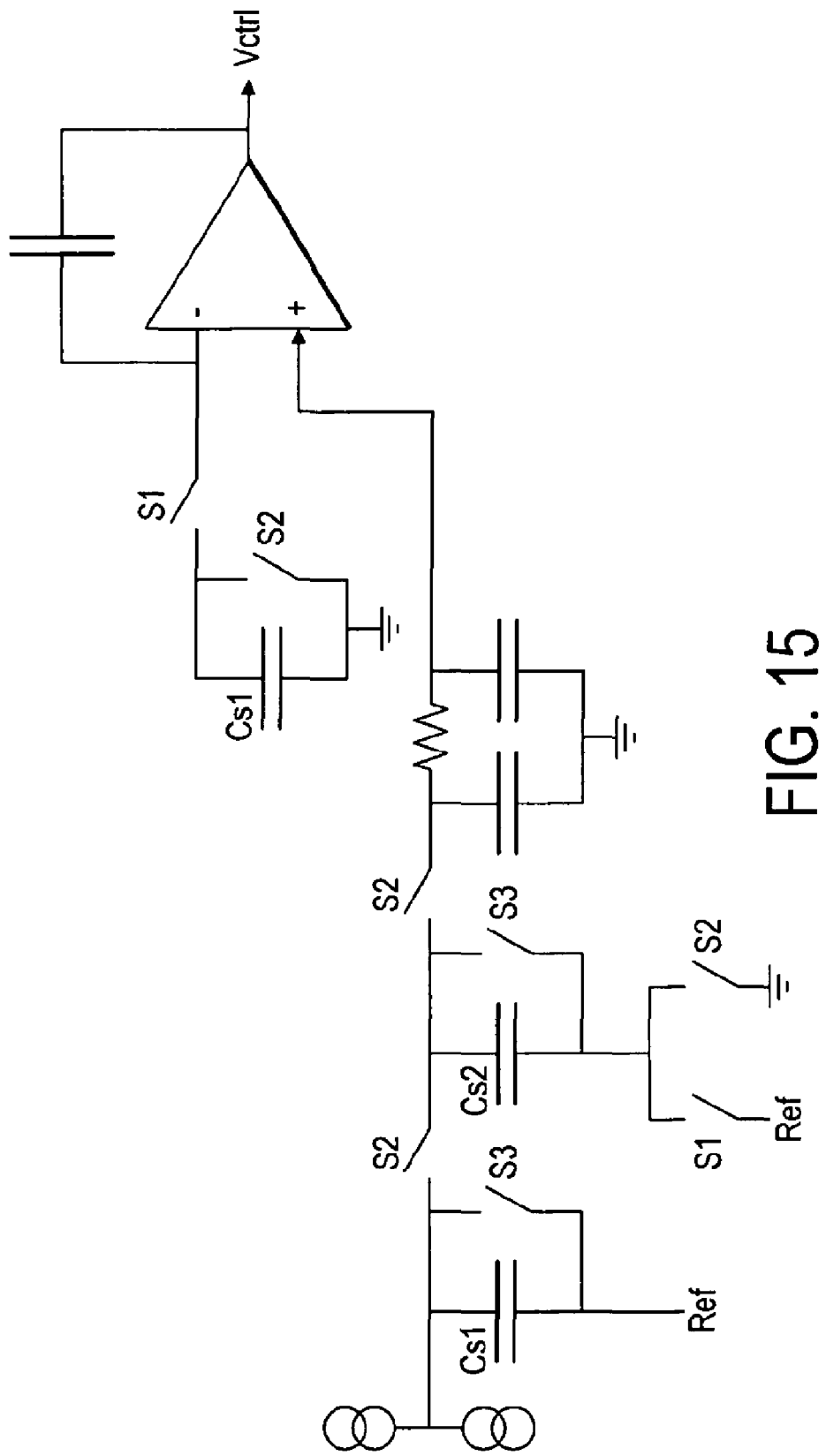
FIG. 15 shows a loop filter comprising the circuit of FIG. 14.

FIG. 15 shows the switched capacitor integral path of FIG. 14 incorporated into a complete loop filter.

As mentioned above, the filters described herein are full tunable since the poles, zeros and gain can be set independently. The poles, zeros and gain of the circuit can be dynamically adjusted during operation (e.g. by using digitally adjustable capacitors). The circuit may therefore be optimised for fast lock, e.g. by using a large charge pump current and low value capacitors in the integral path. The circuit could also be optimised for low power operation, e.g. by using a low charge pump current and low value capacitors. The loop may also be optimised for the different requirements of transmit and receive operations.

As an example, the phase-locked loop may be configured for a wider bandwidth during transmit operations. This is because local oscillator pulling effects can occur between the power amplifier output and the voltage-controlled oscillator during transmit operations. During receive operations, the phase-locked loop may be configured to minimise phase noise in order to lower the contribution of local oscillator phase noise to overall receiver sensitivity. Minimising phase noise typically requires a smaller bandwidth and a higher charge pump current (which minimises the noise contribution of the charge pump).

A disadvantage of using switched capacitors instead of resistors is that the two-stage process required to acquire and then transfer the charge pulses output by the charge pumps results in periods of time during which the phase-locked loop is not "listening" to the input signal. This might be because the loop filter is performing DAC compensation or because the loop filter is performing charge transfer. This may be a problem when the phase-locked loop has not "locked", creating a trap which is impossible to escape and thereby preventing the phase-locked loop from locking. One solution is not to implement DAC compensation during signal acquisition. Another solution is to use two PFDs so that one PFD is continuously monitoring the phase difference and updating the state machine accordingly, even if that information is not passed to the PFD charge pump during DAC compensation.

It should be understood that the specific circuits illustrated and described are given for the purposes of example only. The invention encompasses any circuit that implements the design principles described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A loop filter for receiving an input signal indicative of a phase difference between a reference signal and a signal output by a signal generator and forming a control signal for controlling the signal generator in dependence thereon, the loop filter comprising a plurality of filter components that determine the frequency response of the filter, said filter components being arranged so that a first set of said components determines one or more zeros of the filter's frequency response and a second set of said components determines one or more poles of the filter's frequency response, each of said first and second sets of filter components being independent of the other such that the zero(s) and pole(s) of the filter's frequency response may be selected independently, wherein one or more of the filter components has a resistance and/or reactance that is adjustable such that the bandwidth of the loop filter may be dynamically tuned.

2. A loop filter as claimed in claim 1, wherein the loop filter is arranged such that each of the gain, pole(s) and zero(s) of the filter's frequency response may be adjusted independently by means of the adjustable resistance and/or reactance.

3. A loop filter as claimed in claim 1, wherein the control signal comprises a proportional component and an integral component, and wherein the loop filter comprises a proportional path arranged to generate the proportional component of the control signal and an integral path arranged to generate the integral component of the control signal.

4. A loop filter as claimed in claim 3, wherein the first set of components forms the proportional path.

5. A loop filter as claimed in claim 3, wherein the second set of components form the integral path.

6. A loop filter as claimed in claim 3, wherein the loop filter comprises an input node arranged to receive a signal indicative of the instantaneous phase difference between the output signal and the reference signal, the proportional path being connected to that input node.

7. A loop filter as claimed in claim 3, wherein the integral path is arranged to receive the proportional component of the control signal output by the proportional path, said proportional path being representative of the instantaneous magnitude of the phase difference.

8. A loop filter as claimed in claim 3, wherein the loop filter comprises an output node connectable to a control input of the signal generator, the integral path being connected to that output node.

9. A loop filter as claimed in claim 8, wherein the integral path is arranged to integrate the proportional component and to sum this integral with the proportional component such that the signal output to the signal generator represents the integral component and the proportional component.

10. A loop filter as claimed in claim 3, wherein the proportional path comprises a resistive element.

11. A loop filter as claimed in claim 10, wherein the proportional path comprises a low pass filter.

12. A loop filter as claimed in claim 11, wherein the loop filter comprises an input node arranged to receive a signal indicative of the instantaneous phase difference between the output signal and the reference signal, the proportional path being connected to that input node and wherein the resistive element is connected between the input node and the low pass filter.

13. A loop filter as claimed in claim 12, wherein the resistive element is a switched capacitor comprising a capacitive element, a first switch connected to the input node and a second switch connected to the low-pass filter, the capacitive element being coupled between the first and second switches such that, when the first switch is closed, a current flows from the input node to the capacitive element, and when the second switch is closed, a current flows from the capacitive element to the low pass filter.

14. A loop filter as claimed in claim 13, wherein one end of the capacitive element is connected to the first and second switches and the other end of the capacitive element is connected to a further switch, said further switch being capable of connecting the other end of the capacitive element to either a reference voltage or to circuit ground.

15. A loop filter as claimed in claim 14, wherein the loop filter is arranged to perform a two-stage filtering process such that, during a first time period, the first switch connects said one end of the capacitive element to the input node, the second switch being open, and the further switch connects the other end of the capacitive element to the reference voltage, whereby current flows from the input node to the capacitive element, and during a second time period, the second switch connects said one end of the capacitive element to the low pass filter, the first switch being open, and the further switch connects the other end of the capacitive element to circuit ground, whereby current flows from the capacitive element to the low pass filter.

16. A loop filter as claimed in claim 11, wherein the integral path is connected to the output of the low-pass filter of the proportional path.

17. A loop filter as claimed in claim 11, wherein the integral path comprises a differential amplifier comprising a first input arranged to receive the output of the low-pass filter of the proportional path.

18. A loop filter as claimed in claim 17, wherein the differential amplifier comprises an output connected to the control input of the signal generator.

19. A loop filter as claimed in claim 17, wherein the differential amplifier comprises a second input connected to a resistive element.

20. A loop filter as claimed in claim 19, wherein the resistive element connected to the second input of the differential amplifier is a switched capacitor.

21. A loop filter as claimed in claim 20, wherein the switched capacitor comprises a capacitive element and first and second switches, the capacitive element having one end connected to the first and second switches and the other end connected to the first switch and a reference voltage, the second switch being connected to the second input of the differential amplifier, the integral path being arranged such that:
when the first switch is closed and the second switch is open, both ends of the capacitive element are connected to the reference voltage; and
when the first switch is closed and the second switch is open, said one end of the capacitive element is connected to the second input of the differential amplifier and said other end is connected to the reference voltage.

22. A loop filter as claimed in claim 21, wherein the differential amplifier is arranged such that a gain of the differential amplifier is dependent on a switching frequency of the first and second switches.

23. A loop filter as claimed in claim 17, wherein the differential amplifier is arranged such that a gain of the differential amplifier is dependent on a capacitor ratio.

24. A phase-locked loop comprising a loop filter as claimed in claim 1.

25. A phase-locked loop comprising a loop filter as claimed in claim 13, wherein the phase-locked loop comprises a control unit arranged to control the operation of the switches.

* * * * *